US006707408B2

(12) United States Patent
Guedon et al.

(10) Patent No.: US 6,707,408 B2
(45) Date of Patent: Mar. 16, 2004

(54) SIGMA-DELTA PULSE-WIDTH-MODULATED SIGNAL GENERATOR CIRCUIT

(75) Inventors: Yannick Guedon, Sassenage (FR); Philippe Maige, Seyssinet-Pariset (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/232,954

(22) Filed: Aug. 29, 2002

(65) Prior Publication Data

US 2003/0062964 A1 Apr. 3, 2003

(30) Foreign Application Priority Data

Sep. 3, 2001 (FR) .............................. 01 11369

(51) Int. Cl.[7] ............................... H03M 3/00
(52) U.S. Cl. ................. 341/143; 341/118; 331/25; 332/144; 332/127
(58) Field of Search ................. 341/143, 118; 331/116; 327/147, 115; 375/327; 332/127, 109, 101

(56) References Cited

U.S. PATENT DOCUMENTS

| 4,743,783 A | 5/1988 | Isbell et al. ............... 307/498 |
| 5,834,987 A | * 11/1998 | Dent ........................... 332/127 |
| 6,008,703 A | * 12/1999 | Perrott et al. ............... 332/100 |
| 6,011,815 A | * 1/2000 | Eriksson et al. ............ 375/296 |
| 6,208,216 B1 | 3/2001 | Nasila ......................... 332/110 |
| 6,219,397 B1 | * 4/2001 | Park ............................ 375/376 |
| 6,456,164 B1 | * 9/2002 | Fan ............................... 331/16 |
| 6,504,498 B1 | * 1/2003 | O'Brien ...................... 341/143 |
| 2002/0030546 A1 | * 3/2002 | Keating ......................... 331/2 |

FOREIGN PATENT DOCUMENTS

EP 0 875 994 A1 11/1998

OTHER PUBLICATIONS

Kheraluwala, M. et al., "Delta Modulation Strategies for Resonant Link Inverters," *IEEE Trans. on Power Electronics*, 5(2):220–228, Apr. 1990.

* cited by examiner

*Primary Examiner*—Brian Young
*Assistant Examiner*—John Nguyen
(74) *Attorney, Agent, or Firm*—Lisa K. Jorgenson; Robert Iannucci; Seed IP Law Group PLLC

(57) ABSTRACT

A circuit for generating a pulse-width-modulated signal comprises a phase-locked loop (PLL) having a duty-cycle-insensitive phase comparator and a Sigma-Delta pulse width modulation circuit suitable for providing the voltage-controlled oscillator function of the PLL. Thereby, frequency of the signal generated is synchronized by the PLL to the specified frequency of a synchronization signal, and is thus independent of the duty cycle.

20 Claims, 3 Drawing Sheets

SIGMA-DELTA PULSE-WIDTH-MODULATED SIGNAL GENERATOR CIRCUIT

BACKGROUND OF THE INVENTION

1. Field of the Invention

The present invention relates to a Sigma-Delta pulse-width-modulated signal generator circuit. Applications of the invention are in particular in vertical scan circuits for a television screen or a computer monitor of the CRT (Cathode Ray Tube) type. In such an application, the pulse-width-modulated signal is used as a signal for switching a power supply voltage so as to control electron-beam vertical deflection electrodes.

2. Description of the Related Art

Pulse width modulation or PWM is widely used in electronics, especially in switched-mode power supply circuits for controlling the current in an inductive load. In general, a pulse-width-modulated signal is obtained by comparing a modulation signal which is a DC voltage with a sawtooth signal of defined fixed frequency. The pulse-width-modulated signal therefore has a fixed frequency which is that of the sawtooth signal.

The pulse-width-modulated signal is advantageously obtained by using a Sigma-Delta ($\Sigma$-$\Delta$) pulse width modulation circuit (hereafter called PWM circuit).

The principle of a Sigma-Delta PWM circuit consists in integrating a modulation signal ("Sigma" operation) and then in comparing it with a reference voltage ("Delta" operation). This principle is described, for example, in the article by Mustansir H. Kheraluwala et al., "*Delta Modulation Strategies for Resonant Link Inverters*", IEEE Transactions On Power Electronics, Vol. 5, No. 2, April 1990.

According to one characteristic of Sigma-Delta PWM circuits, the frequency of the pulse-width-modulated signal is not fixed. In particular, it depends on the duty cycle of the signal. This constitutes a drawback in an application of the aforementioned type when it is desired to synchronize the switching signal with the horizontal scan frequency or line frequency so that one period of the switching signal corresponds to the scan time of a horizontal line of the screen. Typically, the line frequency is 15 kHz (kilohertz) for a CRT television screen and between 20 and 150 kHz for a CRT computer monitor.

BRIEF SUMMARY OF THE INVENTION

An embodiment of the present invention provides a pulse-width-modulated signal generator circuit comprising a Sigma-Delta PWM circuit which is synchronized so as to obtain a pulse-wide-modulated signal whose frequency is independent of the duty cycle.

An aspect of the invention relates to a circuit for generating a pulse-width-modulated signal, comprising a phase-locked loop having: a duty-cycle-insensitive phase comparator which receives on a first input a synchronization signal and delivers as output a phase error signal; a loop filter; and also a Sigma-Delta pulse width modulation circuit which has at least one modulation input for receiving a modulation signal, an oscillation frequency control input and an output for delivering as output the pulse-width-modulated signal. The pulse width modulation circuit receives, on the oscillation frequency control input, the phase error signal filtered by the loop filter. The phase comparator furthermore receives the said pulse-width-modulated signal on a second input.

Stated otherwise, the PWM circuit comprises means for providing a voltage-controlled oscillator or VCO function. It therefore provides both the PWM circuit function and the VCO function. This is why, in the rest of the text and in the figures this circuit is called a PWM-VCO circuit. This PWM-VCO circuit is connected as the VCO of the PLL. In this way, the oscillation frequency of the PWM circuit is synchronized by the PLL to the synchronization signal frequency.

In one embodiment, the pulse width modulation circuit comprises an astable differential circuit which comprises two differential inputs constituting two modulation inputs for receiving the modulation signal, and which comprises a controlled current source for delivering a current into the differential circuit according to the signal received on the oscillation frequency control input.

In an exemplary embodiment, the current source is voltage-controlled.

In addition, in one embodiment, the astable differential circuit comprises two branches connected between a first power supply terminal and a second power supply terminal. Each branch contains a bipolar transistor whose emitter is connected to the first power supply terminal via a respective emitter impedance and via the current source and whose collector is connected to the second power supply terminal via a capacitor having the same value. Further, the respective collectors of the transistors are each connected to a respective input of a flip-flop via a respective comparator, the non-inverting input of each of which receives the same reference voltage. Each of the branches further contains a respective MOS transistor connected in parallel to the capacitor of the branch, the outputs of the flip-flop being connected to the respective control gates of these transistors, each via two series-connected logic inverters. The respective bases of the bipolar transistors constitute the two differential inputs of the astable differential circuit, and the node located between the two inverters of a specified branch constitutes the output of the pulse width modulation circuit.

In one exemplary embodiment, the phase comparator comprises a sequential phase detector comprising four flip-flops and also a four-input NAND logic gate.

DETAILED DESCRIPTION OF THE INVENTION

Figure 1:
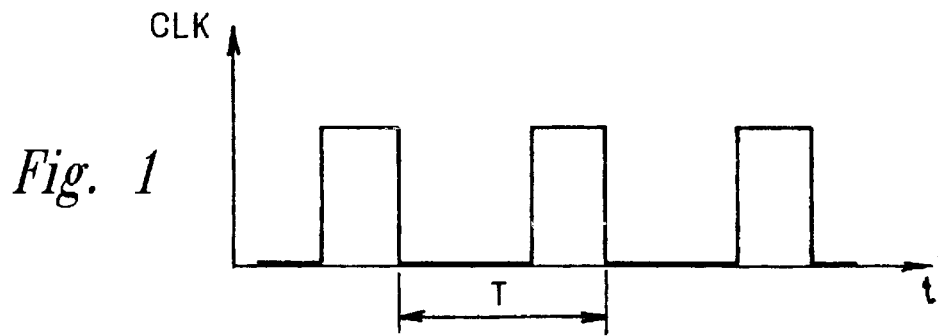
FIG. 1 is a timing diagram showing the waveform of a pulse-width-modulated signal.

The pulse width modulation of a periodic electrical signal consists in varying the instant of the transition from a first electrical voltage level (for example a low level of 0 volts) to a second electrical voltage level (for example a high level of +5 volts) within a period T of this signal. The ratio of the time during which the signal is in the said first electrical voltage level to the period T of the signal is called the duty cycle. For the electrical signal whose waveform is shown by the timing diagram of FIG. 1, the duty cycle is equal to one third (i.e., 33%, according to a percentage notation widely used). In the type of application envisaged here, the duty cycle typically varies between 15% and 85%.

Figure 2:
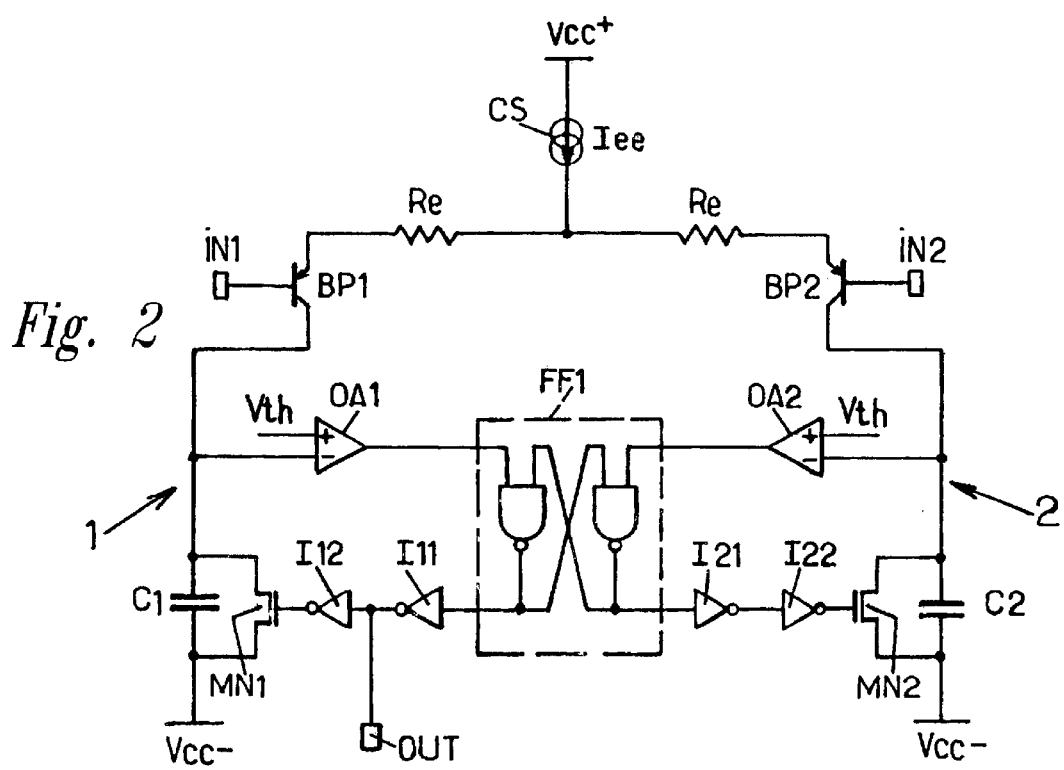
FIG. 2 is a diagram of one embodiment of a Sigma-Delta PWM circuit of a circuit according to one embodiment of the invention.

The circuit diagram of FIG. 2 gives an exemplary embodiment of a Sigma-Delta PWM circuit. It will be shown later, with reference to the circuit diagram of FIG. 6, how this circuit is tailored to constitute a PWM-VCO circuit according to embodiments of the invention.

The Sigma-Delta PWM circuit comprises an astable differential circuit. The latter comprises two differential branches 1 and 2 connected between a positive power supply terminal Vcc+ and a negative power supply terminal Vcc− or ground. Each branch, 1 or 2 respectively, contains a pnp bipolar transistor, BP1 or BP2 respectively, the emitter of which is connected to the Vcc+ terminal via a respective emitter impedance Re and via a common current source CS delivering a current Iee and the collector of which is connected to the Vcc− terminal via a capacitor, C1 or C2 respectively. The capacitors C1 and C2 have the same value, denoted C hereafter.

A modulation signal VINpwm is delivered between the respective bases of the transistors BP1 and BP2 which constitute two differential inputs of the astable differential circuit. The respective collectors of the transistors BP1 and BP2 are furthermore each connected to a respective input of a flip-flop FF via a respective comparator, labelled OA1 and OA2 respectively. The flip-flop FF is, for example, an R-S flip-flop comprising two crossed NOR logic gates, which changes state on the falling edges. The comparators OA1 and OA2 consist, for example, of operational amplifiers whose non-inverting inputs both receive the same reference voltage Vt.

Each branch 1 and 2 of the circuit furthermore includes an n-type MOS transistor, MN1 and MN2 respectively, connected in parallel to the respective capacitor C1 and C2 of the branch. The outputs of the flip-flop FF are connected to the respective control gates of the transistors MN1 and MN2, each via two series-connected logic inverters, respectively I11 and I12, and I21 and I22.

An output OUT of the circuit is taken, for example, off the node located between the inverters I11 and I12, although it may also be taken off the node located between the inverters I21 and I22. In practice, this output OUT is, for example, connected to a switched-mode power supply circuit controlled by the circuit of FIG. 2. The output OUT delivers in fact a square periodic signal which is pulse-width-modulated according to the modulation signal applied between the differential inputs IN1 and IN2.

The operation of each branch 1 and 2 of such a circuit is symmetrical with respect to that of the other branch. The operation is as follows.

At any instant, the equation I1+I2=Iee is true, that is to say the current Iee is divided between the branches 1 and 2. In addition, the transistors BP1 and BP2 are arranged so that they are used in their linear operating region, for all values of the modulation signal applied between the differential inputs IN1 and IN2.

Let us suppose that at a given instant the state of the flip-flop FF is such that the transistor MN1 (alternatively MN2) of the branch 1 (alternatively 2) is in the off state and that the transistor MN2 (alternatively MN1) of the branch 2 (alternatively 1) is in the on state. The current I1 (alternatively I2) which flows in the branch 1 (alternatively 2) charges the capacitor C1 (alternatively C2). When the voltage on the collector of the transistor BP1 (alternatively BP2) exceeds the reference voltage Vth, the output signal of the comparator OA1 (alternatively OA2) switches from the logic high state to the logic low state (falling edge), so that the flip-flop FF changes state. The transistor MN1 (alternatively MN2) conducts, so that the capacitor C1 (alternatively C2) is short-circuited and discharged to the terminal Vcc− via the transistor MN1 (alternatively MN2).

The only dissymmetry between the branches 1 and 2 comes from the respective charging times for the capacitors C1 and C2, which depend on the variation in the potential on the respective bases of the transistors BP1 and BP2, that is to say on the modulation signal. This is what allows the duty cycle of the signal delivered by the output OUT to be varied.

The circuit of FIG. 2 is self-oscillating. Its oscillation frequency depends on the value of the current Iee delivered by the current source CS, on the value C of the capacitors C1 and C2 and on the reference voltage Vth. Moreover, the oscillation frequency also depends on the duty cycle, denoted τ hereinafter and in the figures. This is one of the characteristics of Sigma-Delta PWM circuits.

If a value $$Fo = \frac{Iee}{4 \cdot C \cdot Vth}$$

and a parameter m=2τ−1, are set, then the oscillation frequency F of the circuit of FIG. 2 is given as a function of the parameter m by the following equation:

$$F(m)=Fo \cdot (1-m^2) \qquad (1)$$

Figure 3:
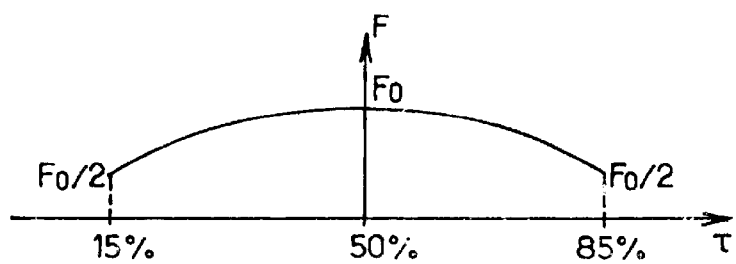
FIG. 3 is a graph showing the variation in the oscillation frequency of the PWM circuit of FIG. 2 as a function of the duty cycle of the pulse-width-modulated signal generated.

The graph of FIG. 3 shows the variation in the oscillation frequency F as a function of the duty cycle τ. The frequency F(m) is a maximum for m=0, that is to say when τ=50%. One then speaks of the Sigma-Delta PWM circuit being balanced, since the currents I1 and I2 in the two branches 1 and 2 are then identical and equal to ½Iee. Furthermore, the frequency F(m) tends towards zero as m tends towards 1 or towards −1, that is to say as τ tends towards zero or towards 100%, respectively. In practice, the values of the duty cycle τ lie between approximately 15% and 85%. For these τ values, the oscillation frequency F is approximately equal to ½Fo.

Figure 4:
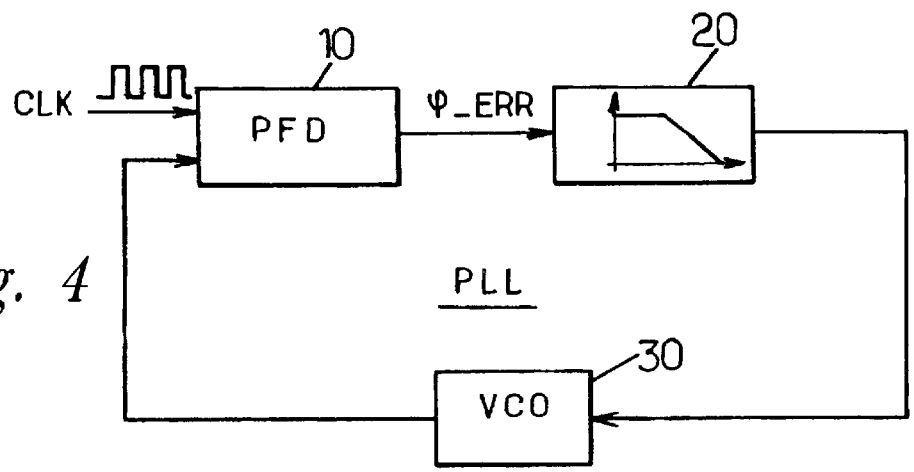
FIG. 4, a block diagram illustrating the principle of a PLL.

The block diagram of FIG. 4 illustrates the principle of a PLL.

A PLL comprises a phase comparator 10 or PFD (Phase/Frequency Differentiator) which receives, on a first input, a synchronization signal having a defined frequency, such as a clock signal CLK, and which delivers as output a phase error signal Φ-ERR. It also comprises a loop filter 20 which is generally a low-pass filter. It furthermore comprises a voltage-controlled oscillator 30 or VCO.

An oscillation frequency control input of the VCO receives the phase error signal Φ-ERR via the filter 20. In other words, the oscillation frequency of the VCO is controlled by a signal corresponding to the Φ-ERR signal filtered by the loop filter 20. The signal delivered as output by the VCO is received on a second input of the phase comparator 10, so that its phase (or its frequency, which amounts to the same thing) is compared with that of the synchronization signal CLK. It follows that the frequency of the signal delivered as output by the VCO is slaved to the frequency of the synchronization signal CLK.

According to embodiments of the invention, the oscillation frequency of the Sigma-Delta PWM circuit is synchronized by a PLL. For this purpose, the Sigma-Delta PWM circuit comprises means for simultaneously providing a pulse width modulation circuit function and a voltage-controlled oscillator function. In other words, the PWM circuit is designed to operate as a voltage-controlled oscillator and, in addition, it is inserted into a PLL of the type shown in the diagram of FIG. 4 instead of the VCO.

Figure 5:
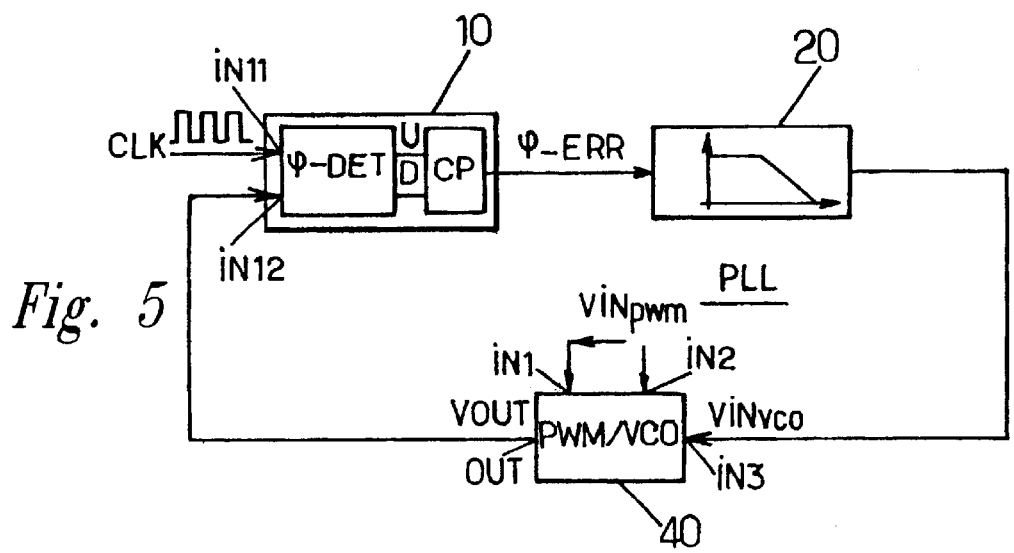
FIG. 5, a block diagram illustrating the principle of a circuit according to one embodiment of the invention.

In this way, a pulse-width-modulated signal generator circuit according to embodiments of the invention is obtained as in the diagram of FIG. 5. In this figure and hereinafter, the Sigma-Delta PWM circuit also operating as a voltage-controlled oscillator is called a PWM-VCO circuit, so as to indicate the fact that it provides both the function of a PWM circuit and that of a VCO.

In FIG. 5, in which the same elements as in FIGS. 2 and 4 bear the same references, the PLL again includes a phase comparator 10, the first and second inputs of which are denoted IN11 and IN12 respectively, and a loop filter 20. It furthermore includes a PWM-VCO circuit with the reference 40, which is placed in the PLL instead of the VCO bearing the reference 30, of the PLL in FIG. 4.

The PWM-VCO circuit comprises two modulation inputs, IN1 and IN2 respectively, between which a differential voltage is inserted, corresponding to the modulation signal denoted VINpwm (so as to provide the PWM circuit function) and also includes an oscillation frequency control input INvco for receiving an oscillation frequency control signal denoted VINvco (so as to provide the VCO function). The oscillation frequency control signal VINvco corresponds to the phase error signal Φ-ERR, filtered by the loop filter 20. The PWM-VCO circuit furthermore includes an output OUT delivering a signal VOUT which is taken onto the second input of the phase comparator 10. This signal VOUT is a pulse-width-modulated signal whose frequency is synchronized to the frequency of the synchronization signal CLK.

The PWM/VCO circuit 40 comprises an astable differential circuit like that shown in the diagram of FIG. 2, the inputs IN1 and IN2 of which are differential inputs. Furthermore, the current source CS of this circuit is produced by a voltage-controlled current source.

Figure 6:
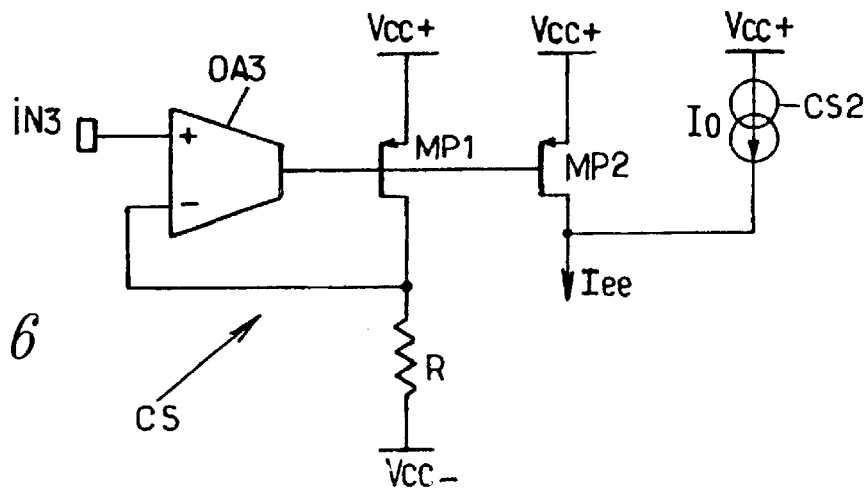
FIG. 6, a circuit diagram illustrating one embodiment of a voltage-controlled current source included in the PWM circuit of FIG. 2.

FIG. 6 is a schematic representation of such a current source.

The current source CS comprises, for example, two p-type MOS transistors, MP1 and MP2, the sources of which are connected to the positive supply terminal Vcc+ and the control gates of which are connected together. In this way, the transistors MP1 and MP2 are connected as a current mirror.

The drain of the transistor MP1 is connected to the negative supply terminal Vcc− or to the ground via a resistor R of given value. The drain of the transistor MP2 constitutes the output of the current source CS and is connected to the common emitters of the transistors BP1 and BP2 of the astable differential circuit (FIG. 2).

The current source CS also includes a current source CS2 which is connected between the positive supply terminal Vcc+ and the drain of the transistor MP2, and which delivers a fixed current Io.

The current source CS furthermore includes an input node IN3 and an operational amplifier OA3 connected up as a voltage follower, the non-inverting input of which is connected to the input node IN3 in order to receive the signal VINvco and the inverting input of which is connected to the drain of the transistor MP1. The potential on this drain is then imposed by the signal VINvco, thereby determining the voltage across the terminals of the resistor R and therefore the current Iee delivered by the current mirror, given the following equation:

$$Iee = \frac{VINvco - Vcc-}{R} + Io \qquad (2)$$

The current Iee delivered by the current source CS is therefore controlled by the signal VINvco received on the input IN3. However, as was mentioned above, the aforementioned frequency Fo of the PWM-VCO circuit depends on the current Iee. Consequently, the oscillation frequency F of the PWM-VCO circuit is controlled by the signal VINvco received on the input IN3. In other words, the input IN3 is an oscillation frequency control input of the PWM-VCO circuit.

Turning back to the diagram in FIG. 5, it will be noted that the phase comparator comprises, as is known, a phase detector Φ-DET followed by a charge pump CP. The function of the phase detector Φ-DET is to deliver two signals, conventionally denoted U and D, according to the phase difference between the signals CLK and VOUT received on the inputs of the phase comparator 10. These signals U and D control the charge pump CP which has the function of generating the phase error Φ-ERR delivered by the output of the phase comparator 10.

According to embodiments of the invention, the phase detector Φ-DET is insensitive to the duty cycle of the signals CLK and VOUT.

Figure 7:
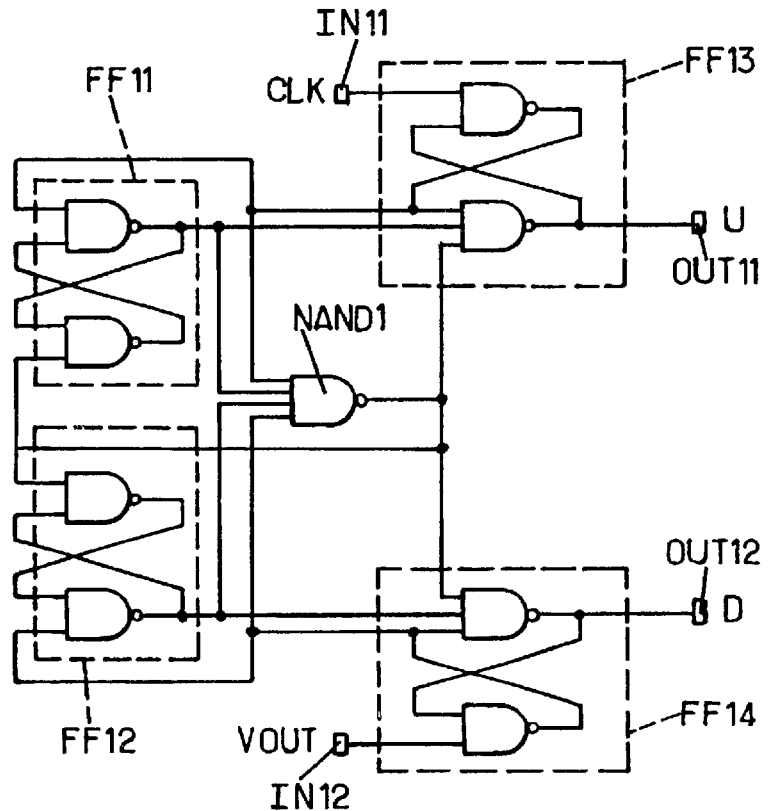
FIG. 7 is the circuit diagram of an embodiment example of the PLL phase comparator of the circuit according to one embodiment of the invention.

An exemplary embodiment of such a duty-cycle-insensitive phase detector known per se is shown schematically in FIG. 7.

This is a sequential phase detector comprising four R-S flip-flops, FF11, FF12, FF13, and FF14 respectively, each produced with two NAND logic gates, and further comprising one four-input NAND logic gate NAND1. Such a phase detector is described in detail in the work by Alan B. Grebene, *"Bipolar and CMOS Analog Integrated Circuit Design"*, published by John Wiley & Sons, 1984, pages 664–668.

The phase detector comprises two inputs, which are the inputs IN11 and IN12 of the phase comparator 10, for receiving the synchronization signal CLK and the output signal VOUT of the PWM-VCO circuit, respectively. It furthermore comprises two outputs OUT11 and OUT12 for delivering the aforementioned signals U and D respectively. Since this is a sequential circuit, the description of its structure and of its operation is complex and would be outside the scope of the present description. If necessary, the reader should refer to the aforementioned work.

Figure 8:
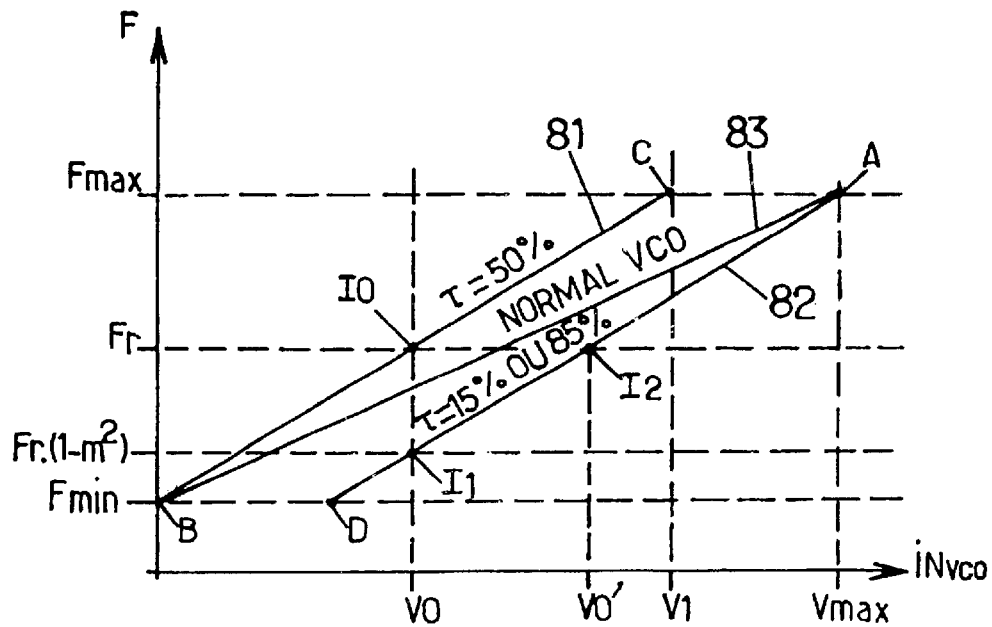
FIG. 8 is a graph illustrating voltage-frequency characteristics of the PWM-VCO circuit according to one embodiment of the invention for various duty cycle values, as well as the characteristic of a conventional VCO, each for the same range of variation in the frequency of the signal generated and in the oscillation frequency control voltage.

It will be mentioned only that, as this phase detector is activated by the falling edges of the pulses of the signals CLK and VOUT, such a circuit is insensitive to the duty cycle of these signals The operation of the PWM-VCO circuit will now be described with regard to the graph in FIG. 8. Let us firstly take a given duty cycle, for example of 50%. For this duty cycle value, the voltage-frequency characteristic of the PWM-VCO circuit (the response of the circuit as a VCO is shown in FIG. 8 by curve 81. Corresponding to the aforementioned given value of the duty cycle is a given value of the oscillation frequency F, which is determined by Equation (1) given above. Furthermore, according to the principle of a PLL, the oscillation frequency is synchronized to the frequency of the synchronization signal CLK, this frequency being denoted Fr in the figure and hereinafter, because of the fact that the PLL is locked onto this frequency. Hereinafter, the frequency Fr is also called the rest frequency. The oscillation frequency control voltage VINvco therefore adjusts itself to a value V0 so that the oscillation frequency F is equal to the rest frequency Fr. This corresponds to the point labelled I0 on curve 81.

When the duty cycle varies, the PLL remains locked onto the rest frequency Fr of the synchronization signal CLK, since the PFD is insensitive to the duty cycle. However, the oscillation frequency F of the PWM-VCO circuit varies as a function of the duty cycle, again according to Equation (1) given above. Let us consider, for example, $\tau=15\%$ or $\tau=85\%$. For such a duty cycle value, the voltage-frequency characteristic of the PWM-VCO circuit (the response of the circuit as a VCO) is shown in FIG. 8 by curve 82. Curve 82 has the same slope as curve 81, but it is translated towards the higher values of the voltage VINvco compared with the latter. The constancy of the slope of the characteristic reflects the invariance of the gain of the PWM-VCO circuit as a VCO, that is to say the gain G expressed in rad.s$^{-1}$.V$^{-1}$ (radian/second/volt) by the following equation:

$$G = \frac{2\pi \Delta F}{\Delta VINvco} \quad (3)$$

For a constant oscillation control voltage, that is to say for VINvco=V0, the frequency F should then be equal to $(1-m^2)$.Fr, that is to say approximately ½Fr. This would be the point denoted I1 on the curve 82. This point is lower than the aforementioned point I0, which means that the oscillation frequency F decreases as the duty cycle varies around 50% (in accordance with Equation (1) and the graph in FIG. 3). But in fact, since the PLL remains locked to the frequency Fr, the voltage VINvco adjusts itself to a particular value V0' so that the oscillation frequency F is always equal to the rest frequency Fr. This corresponds to the point denoted I2 on curve 82.

In other words, when the duty cycle varies around the value $\tau=50\%$, the oscillation frequency F has a tendency to decrease, but it is kept at the rest frequency Fr by the PLL via a corresponding increase in the oscillation frequency control voltage VINvco.

It follows from the foregoing that the oscillation frequency control voltage VINvco must be able to follow the variation in the duty cycle. It is therefore necessary to make sure that the variation in the modulation signal VINpwm is not masked by the loop filter 20 of the PLL. When the invention is applied to the generation of a power supply voltage switching signal for a vertical scan circuit of a CRT screen or a computer monitor, the modulation signal varies at a frequency which is equal to the vertical scan frequency of the screen (typically 50 or 100 hertz according to the French standards in the case of CRT screen and from 50 to 200 hertz in the case of a computer monitor). It is therefore necessary for the cut-off frequency of the loop filter to be well above the said frequency. In practice, a difference of a decade between these frequencies is easily enough.

Furthermore, the gain of the PWM-VCO circuit as a VCO must be adjusted so that the output frequency covers an entire desired range for a given range of variation in the oscillation frequency control voltage VINvco, taking into account the possible variation in the duty cycle over its entire range of variation.

In other words, the slope of the voltage-frequency characteristic (which corresponds, depending on the specified value of the duty cycle between 15% and 85%, to a curve lying between curve 81 and curve 82 and being parallel to these curves) must be defined so as to cover the entire desired frequency range, while the oscillation frequency control voltage VINvco covers only part of its possible range of variation. This is explained below with reference again to the graph in FIG. 8.

Let us assume that the desired frequency range is between a minimum value Fmin and a maximum value Fmax and that the voltage VINvco can vary between 0 and a maximum value Vmax which may correspond to the positive power supply voltage Vcc+.

For a normal VCO, the characteristic is that shown by curve 83. It passes through the point denoted A for which F=Fmax and VINvco=Vmax and through the point B for which F=Fmin and VINvco=0. Its slope corresponds to a gain Go given by the following equation:

$$Go = 2\pi \cdot \frac{F\max - F\min}{V\max - 0} = 2\pi \cdot \frac{F\max - F\min}{V\max} \quad (4)$$

For a PWM-VCO circuit according to embodiments of the invention, for $\tau=50\%$, the characteristic is that shown by curve 81. It passes through a point denoted B, for which F=Fmin and VINvco=0, through the point I0, for which F=Fr and VINvco=V0, and also through a point denoted C, for which F=Fmax and VINvco=V1. In general, the aim is for the rest point I0 to be in the middle of the characteristic shown by curve 81, which imposes the additional condition V0=½V1. The gain G is then given by the following equation:

$$Go = 2\pi \cdot \frac{F\max - F\min}{V1 - V0} = 2\pi \cdot \frac{F\max - F\min}{V1} = 2\pi \cdot \frac{F\max - F\min}{2V0} \quad (5)$$

For $\tau=15\%$ or $\tau=85\%$, the characteristic is that shown by curve 82. It passes through the point A, for which F=Fmax et VINvco=Vmax and through the point I1, for which $F=(1-m^2)$.Fr=½Fr and VINvco=V0. The gain G is then given by the following equation:

$$G = 2\pi \cdot \frac{F\max - (1-m^2) \cdot Fr}{V\max - V0} = 2\pi \cdot \frac{F\max - \frac{1}{2}Fr}{V\max - V0} \quad (6)$$

For specified values of Fmax, Fmin, Fr and Vmax, it is possible to obtain the value of V0 by equating the above Equations (5) and (6). Thus, the value of the gain G is obtained from one or other of these equations.

In one example, it is desired that the duty cycle be able to vary between $\tau=15\%$ and $\tau=85\%$, with the following values:
Fr=65 kHz;
Fmin=20 kHz;
Fmax=110 kHz; and
Vmax=5 volts.

In this example, Equation (4) gives Go=113000 rad.s$^{-1}$.V$^{-1}$, and equations (5) et (6) give G=150000 rad.s$^{-1}$.V$^{-1}$. In other words, the gain as a VCO of a PWM-VCO circuit according to embodiments of the invention is approximately equal to four thirds of the gain of a conventional VCO (G=⅓ G₀), for the same ranges of variation in the oscillation frequency and in the oscillation frequency control voltage.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit for generating a pulse-width-modulated signal, comprising:
   a phase-locked loop having:
      a duty-cycle-insensitive phase comparator which comprises a first input configured to receive a synchronization signal, a second input, and an output configured to output a phase error signal;
      a loop filter coupled to the phase comparator and configured to low pass filter the phase error signal; and
      a Sigma-Delta pulse width modulation circuit having a modulation input configured to receive a modulation signal, an oscillation frequency control input configured to receive the phase error signal from the loop filter, and an output configured to output the pulse-width-modulated signal, the second input of the phase comparator being configured to receive the pulse-width modulated signal.

2. The circuit of claim 1, wherein the pulse width modulation circuit comprises an astable differential circuit including two differential inputs configured to receive the modulation signal, and including a controlled current source configured to output a current to the differential circuit according to a signal received on the oscillation frequency control input.

3. The circuit of claim 2, wherein the controlled current source is voltage-controlled.

4. The circuit of claim 2, wherein the astable differential circuit comprises first and second branches both connected between a first power supply terminal and a second power supply terminal,
   wherein each of the first and second branches contains a bipolar transistor whose emitter is connected to the first power supply terminal via a respective emitter impedance and via the current source, and whose collector is connected to the second power supply terminal via a respective capacitor having the same value,
   wherein the collector of the bipolar transistor of each of the first and second branches is further connected a first input of a respective comparator,
   wherein a second input of the comparator of each of the first and second branches receives the same reference voltage,
   wherein the output of the comparator of each of the first and second branches is connected to a respective input of a flip-flop,
   wherein each of the first and second branches further contains a respective MOS transistor connected in parallel to the capacitor of the branch, the output of the flip-flop of the branch being connected to the control gate of the MOS transistor of the branch, via two respective series-connected logic inverters,
   wherein the respective bases of the bipolar transistor of each of the first and second branch constitute the two differential inputs of the astable differential circuit, and
   wherein the node located between the two inverters of one of the first and second branches constitutes the output of the pulse width modulation circuit.

5. The circuit of claim 1, wherein the phase comparator comprises:
   a sequential phase detector comprising four flip-flops; and
   a four-input NAND logic gate.

6. A method comprising:
   receiving a synchronization signal and a first pulse-width-modulated signal, the first pulse-width-modulated signal having a duty cycle;
   generating a phase error signal based upon the synchronization signal and the first pulse-width-modulated signal without significant influence on generation of the phase error signal by the duty cycle of the first pulse-width-modulated signal;
   low pass filtering the phase error signal to generate a filtered phase error signal;
   receiving a modulation signal and the filtered phase error signal; and
   generating a second pulse-width-modulated signal based upon the modulation signal and the filtered phase error signal.

7. The method of claim 6 wherein generating the second pulse-width-modulated signal includes generating a current based upon the filtered phase error signal and taking a difference between the modulation signal and the generated current.

8. The method of claim 6 wherein generating the current includes associating the generated current with a voltage.

9. The method of claim 6 wherein generating a phase error signal includes detecting phase in a sequential manner.

10. A system comprising:
    means for receiving a synchronization signal and a first pulse-width-modulated signal, the first pulse-width-modulated signal having a duty cycle, and for generating a phase error signal based upon the synchronization signal and the first pulse-width-modulated signal without significant influence on generation of the phase error signal by the duty cycle of the first pulse-width-modulated signal;
    means for low pass filtering the phase error signal to generate a filtered phase error signal; and
    means for receiving a modulation signal and the filtered phase error signal and for generating a second pulse-width-modulated signal based upon the modulation signal and the filtered phase error signal.

11. The system of claim 10 wherein means for generating the second pulse-width-modulated signal includes means for generating a current based upon the filtered phase error signal and means for taking a difference between the modulation signal and the generated current.

12. The system of claim 10 wherein means for generating the current includes means for associating the generated current with a voltage.

13. The system of claim 10 wherein means for generating a phase error signal includes means for detecting phase in a sequential manner.

14. The system of claim 10 wherein means for low pass filtering the phase error signal includes a loop filter.

15. The system of claim 10 wherein means for generating a second pulse-width-modulated signal includes a Sigma-Delta pulse width modulation circuit.

16. The system of claim 10 wherein means for generating a phase error signal includes a duty-cycle-insensitive phase comparator.

17. The system of claim 10, wherein the means for generating the second pulse-width-modulated signal includes an astable differential circuit including two differential inputs configured to receive the modulation signal, and including a controlled current source configured to output a current to the differential circuit according to a signal received on the oscillation frequency control input.

18. The system of claim 17, wherein the controlled current source is voltage-controlled.

19. The system of claim 17, wherein the astable differential circuit comprises first and second branches both connected between a first power supply terminal and a second power supply terminal, wherein each of the first and second branches contains a bipolar transistor whose emitter is connected to the first power supply terminal via a respective emitter impedance and via the current source, and whose collector is connected to the second power supply terminal via a respective capacitor having the same value, wherein the collector of the bipolar transistor of each of the first and second branches is further connected a first input of a respective comparator, wherein a second input of the comparator of each of the first and second branches receives the same reference voltage, wherein the output of the comparator of each of the first and second branches is connected to a respective input of a flip-flop, wherein each of the first and second branches further contains a respective MOS transistor connected in parallel to the capacitor of the branch, the output of the flip-flop of the branch being connected to the control gate of the MOS transistor of the branch, via two respective series-connected logic inverters, wherein the respective bases of the bipolar transistor of each of the first and second branch constitute the two differential inputs of the astable differential circuit, and wherein the node located between the two inverters of one of the first and second branches constitutes the output of the pulse width modulation circuit.

20. The system of claim 10, wherein the means for generating the phase error signal includes:

a sequential phase detector comprising four flip-flops each having an output; and a NAND logic gate having four inputs respectively coupled to the outputs of the four flip-flops.

* * * * *